United States Patent
Matsumura et al.

(10) Patent No.: US 6,258,240 B1
(45) Date of Patent: Jul. 10, 2001

(54) ANODIZING APPARATUS AND METHOD

(75) Inventors: Satoshi Matsumura, Atsugi; Kenji Yamagata, Sagamihara, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/211,418

(22) Filed: Dec. 15, 1998

(30) Foreign Application Priority Data

Dec. 26, 1997 (JP) .................................. 9-361013

(51) Int. Cl.$^7$ .............................. C25D 5/02; C25D 7/12; C25D 9/00; C25D 17/00; C25D 39/00
(52) U.S. Cl. ..................... 205/124; 205/147; 205/157; 205/210; 205/316; 205/665; 204/224 R; 204/225; 204/297.14; 156/150
(58) Field of Search ........................ 205/316, 665, 205/157, 147, 124, 210; 204/224 R, 225, 242, 297.14; 156/150, 230

(56) References Cited

U.S. PATENT DOCUMENTS

| | | | | |
|---|---|---|---|---|
| 3,345,274 | * | 10/1967 | Schmidt | 205/316 X |
| 4,069,121 | * | 1/1978 | Baud et al. | 205/665 X |
| 4,447,306 | * | 5/1984 | Ushio et al. | 204/224 R |
| 5,437,777 | * | 8/1995 | Kishi | 204/224 R |

FOREIGN PATENT DOCUMENTS

| | | |
|---|---|---|
| 563625 A2 | 10/1993 | (EP) . |
| 0 597 428 A1 | 5/1994 | (EP) . |
| 846790 A2 | 6/1998 | (EP) . |
| 2 615 036-A1 | 11/1988 | (FR) . |
| 60-94737 | 5/1985 | (JP) . |
| 5-21338 | 1/1993 | (JP) . |
| 6-275598 | 9/1994 | (JP) . |
| 6-338631 | 10/1994 | (JP) . |
| 6-310488 | 11/1994 | (JP) . |
| 8-037173 | 2/1996 | (JP) . |

OTHER PUBLICATIONS

European Search Report dated Apr. 19, 2000.
Patent Abstracts of Japan JP 5–198556 (Canon Inc.), Aug. 6, 1993.
Derwent Abstract Accession No. 94–206586 SE 500333–B (Grimmeiss), Jun. 6, 1994.

* cited by examiner

Primary Examiner—Donald R. Valentine
(74) Attorney, Agent, or Firm—Morgan & Finnegan, LLP

(57) ABSTRACT

It is an object of the present invention to provide an anodizing apparatus capable of efficiently performing anodizing. In order to achieve this object, an anodizing apparatus for anodizing a substrate to be processed in an electrolytic solution includes a process tank for storing the electrolytic solution, the process tank having an opening in a wall, a negative electrode arranged in the process tank to oppose the opening, and a positive electrode contacting a surface of the substrate to be processed which is arranged to close the opening from an inside of the process tank, the surface being open outside the process tank through the opening.

17 Claims, 5 Drawing Sheets

ANODIZING APPARATUS AND METHOD

BACKGROUND OF THE INVENTION

The present invention relates to an anodizing apparatus and method of anodizing a substrate to be processed in an electrolytic solution, and a porous substrate manufactured by the apparatus and method.

Porous silicon was found by A. Uhlir and D. R. Turner who were studying electropolishing of single-crystal silicon biased to a positive potential in an aqueous solution of hydrofluoric acid (to be abbreviated as HF hereinafter).

Later, to exploit the excellent reactivity of porous silicon, application to element isolation in which a thick insulating structure need be formed in manufacturing a silicon integrated circuit was examined, and a full isolation technology using a porous silicon oxide film (FIPOS: Full Isolation by Porous Oxidized Silicon) was developed (K. Imai, Solid State Electron 24, 159, 1981).

Recently, an applied technology to direct bonding in which a silicon epitaxial layer grown on a porous silicon substrate is bonded to an amorphous substrate or single-crystal silicon substrate via an oxide film has been developed (Japanese Patent Laid-Open No. 5-21338).

As another application example, porous silicon which emits light by itself has received a great deal of attention as a so-called photoluminescence or electroluminescence material (Japanese Patent Laid-Open No. 6-338631).

FIG. 5 is a view showing the arrangement of an anodizing apparatus for manufacturing porous silicon by anodizing a silicon substrate, disclosed in Japanese Patent Laid-Open No. 60-94737.

This anodizing apparatus is constituted by arranging anodizing tanks 1802a and 1802b consisting of Teflon (trade mark of du Pont in U.S.A) having an HF resistance to sandwich a silicon substrate 1801. The anodizing tanks 1802a and 1802b have platinum electrodes 1803a and 1803b, respectively.

The anodizing tanks 1802a and 1802b have grooves in side walls contacting the silicon substrate 1801, and 0-rings 1804a and 1804b of fluororubber are fitted in these grooves, respectively. The anodizing tanks 1802a and 1802b and the silicon substrate 1801 are sealed by the 0-rings 1804a and 1804b, respectively. The sealed anodizing tanks 1802a and 1802b are filled with HF solutions 1805a and 1805b, respectively.

In these anodizing tanks, the silicon substrate does not come into direct contact with the metal electrodes and is hardly contaminated by the metal electrodes. However, since the silicon substrate to be anodized is sealed by the 0-rings on its upper and lower surfaces, unanodized portions remain in the peripheral regions on the surfaces of the silicon substrate. In addition, since the silicon substrate to be processed itself is directly set and integrated with the anodizing tanks, the silicon substrate cannot be quickly exchanged.

To solve these problems, an anodizing apparatus which supports a silicon substrate at its side surface (beveling) regions has been developed (Japanese Patent Laid-Open No. 5-198556). This anodizing apparatus can anodize all surface regions of the substrate while preventing contamination from the metal electrode. Additionally, in this anodizing apparatus, since a wafer to be processed is fixed in a holder, and the holder is fixed in the anodizing tanks, i.e., the wafer is fixed in the anodizing tank in two steps, operability is largely improved as compared to the conventional apparatus which directly fixes a wafer in the anodizing tank to integrate the wafer with the anodizing tank.

Another anodizing apparatus has been developed, in which a silicon substrate is arranged between a silicon substrate to be processed and a metal electrode, and the electrode component from the metal electrode is shielded by the silicon substrate to prevent contamination due to the electrode component dissolved in the electrolytic solution (Japanese Patent Laid-Open No. 6-275598).

As still another method of preventing contamination from the electrode, a method of directly fixing the electrode to a silicon substrate to be processed via another silicon substrate has been developed (Japanese Patent Laid-Open No. 8-037173).

The anodizing apparatuses disclosed in Japanese Patent Laid-Open Nos. 5-198556, 6-275598, and 8-037173 are very practical because metal contamination rarely occurs, and all surface regions of a substrate can be anodized.

However, an anodizing apparatus having higher productivity is desired. For example, the silicon substrate arranged between the silicon substrate to be processed and the metal electrode is anodized. The silicon substrate must be discarded because it is in direct contact with the metal electrode or is contaminated by the metal component dissolved in the electrolytic solution, so the silicon material is wasted.

In the method of inserting the silicon substrate as an intermediate substrate between the electrode and the silicon substrate to be processed, the intermediate substrate is also dipped in the electrolytic solution and anodized. Hence, the intermediate substrate must be frequently exchanged, and the silicon material is wasted.

SUMMARY OF THE INVENTION

The present invention has been made to solve the above problems, and has as its object to provide an anodizing apparatus and method capable of efficiently performing anodizing while preventing wafer contamination.

It is another object of the present invention to provide a porous substrate manufactured by the apparatus and method.

In order to solve the above problems and achieve the above object, an anodizing apparatus according to the present invention has the following arrangement.

There is provided an anodizing apparatus for anodizing a substrate to be processed in an electrolytic solution, comprising a process tank for storing the electrolytic solution, the process tank having an opening in a wall, a negative electrode arranged in the process tank to oppose the opening, and a positive electrode contacting a surface of the substrate to be processed which is arranged to close the opening from an inside of the process tank, the surface being open outside the process tank through the opening.

A porous substrate according to the first aspect of the present invention has the following arrangement.

There is provided a porous substrate manufactured by the anodizing apparatus of any one of claims 1 to 14.

An anodizing method according to the present invention has the following steps.

There is provided an anodizing method of anodizing a substrate to be processed in an electrolytic solution, comprising the setting step of setting the substrate to be processed inside a process tank having an opening on a wall to close the opening, the supply step of supplying the electrolytic solution into the process tank, the contacting step of bringing a positive electrode into contact with a portion of the substrate to be processed, which is open outside the process tank through the opening, and the process step of flowing a current between the positive electrode and a negative electrode arranged to oppose the substrate to be processed in the process tank to anodize the substrate to be processed.

A porous substrate according to the second aspect of the present invention has the following structure.

There is provided a porous substrate manufactured by the anodizing method of any one of claims 16 to 17.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENT

An anodizing apparatus according to an embodiment of the present invention will be described below. Before the description, an embodiment of a method of manufacturing a semiconductor substrate using the anodizing apparatus in some steps will be described.

FIGS. 1A to 1F are views showing a method of manufacturing a semiconductor substrate. This will be briefly described. In this manufacturing method, a first substrate prepared by forming a porous silicon layer on a single-crystal silicon substrate, a non-porous layer on the porous silicon layer, and preferably an insulating film on the non-porous layer is bonded to an independently prepared second substrate via the insulating film. After this, the single-crystal silicon substrate is removed from the lower surface of the first substrate, and the porous silicon layer is etched, thereby manufacturing a semiconductor substrate.

The method of manufacturing a semiconductor substrate will be described in more detail with reference to FIGS. 1A to 1F.

Figure 1A:
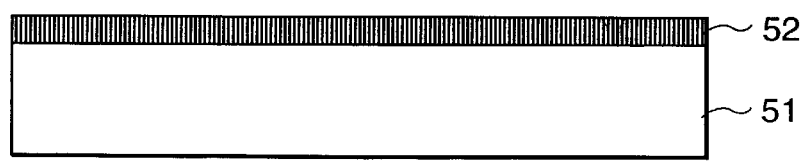
FIGS. 1A to 1F are views showing the steps in manufacturing a semiconductor substrate.

First, a single-crystal Si substrate 51 for forming a first substrate is prepared, and a porous Si layer 52 is formed on the major surface (FIG. 1A). The porous Si layer 52 can be formed by processing the major surface of the single-crystal substrate 51 by the anodizing apparatus of the embodiment to be described later.

Figure 1B:
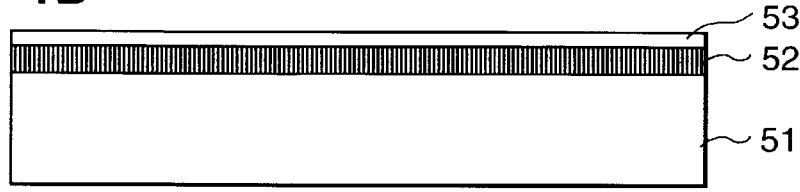

At least one non-porous layer 53 is formed on the porous Si layer 52 (FIG. 1B). As the non-porous layer 53, a single-crystal Si layer, a poly-Si layer, an amorphous Si layer, a metal layer, a semiconductor compound layer, a superconductor layer is suitable. A device structure such as a MOSFET may be formed in the non-porous layer 53.

Figure 1C:
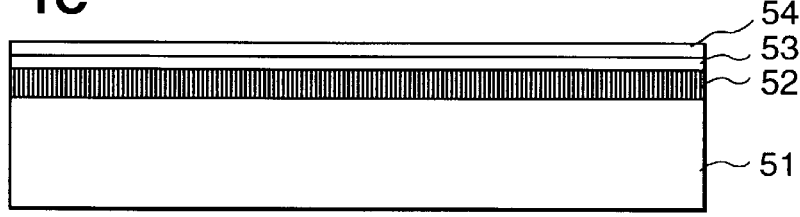

An $SiO_2$ layer 54 is formed on the non-porous layer 53, and the resultant structure is preferably used as the first substrate (FIG. 1C). This $SiO_2$ layer 54 is applicable because when the first substrate is bonded to a second substrate 55 in the subsequent step, the interface level of the bonding interface can be separated from the active layer.

Figure 1D:
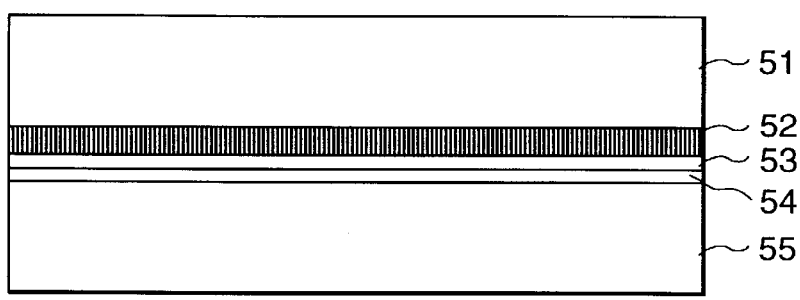

Subsequently, the first substrate is brought into contact with the second substrate 55 at room temperature via the $SiO_2$ layer 54 (FIG. 1D). After this, anode. bonding, pressing, heat treatment as needed, or a combination thereof may performed to firmly bond the substrates.

When a single-crystal Si layer is formed as the non-porous layer 53, the first substrate is preferably bonded to the second substrate 55 after the $SiO_2$ layer 54 is formed on the surface of the single-crystal Si layer by, e.g., thermal oxidation.

As the second substrate 55, an Si substrate, a substrate obtained by forming an $Sio_2$ layer on an Si substrate, a transparent substrate consisting of silica glass, or a sapphire substrate is suitable. Any other substrate can be used as far as the second substrate 55 has a sufficiently flat surface to be bonded.

FIG. 1D shows a state wherein the first substrate and the second substrate are bonded via the $Sio_2$ layer 54. If the non-porous layer 53 or the second substrate does not consist of Si, the $SiO_2$ layer 54 need not be formed.

In bonding, an insulating thin plate may be inserted between the first substrate and the second substrate.

Figure 1E:
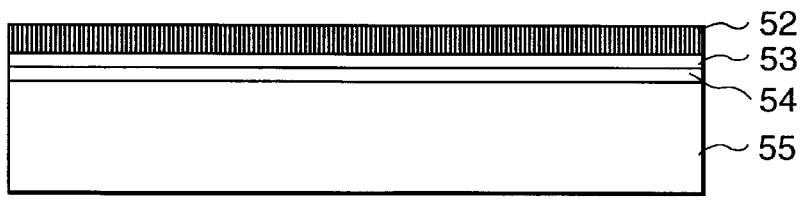

The first substrate is removed from the second substrate at the porous Si layer 52 (FIG. 1E). To remove the first substrate, the first method using grinding, polishing, or etching (the first substrate is discarded) or the second method of separating the first substrate from the second substrate at the porous layer 52 is used. In the second method, when the porous Si layer remaining on the separated first substrate is removed, and the surface is planarized as needed, the substrate can be reused.

Figure 1F:
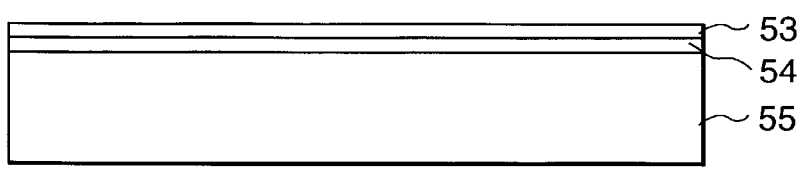

Subsequently, only the porous Si layer 52 is etched and removed while leaving the non-porous layer 53 (FIG. 1F).

FIG. 1F schematically shows a semiconductor substrate obtained by the above manufacturing method. According to the manufacturing method, the non-porous layer 53 (e.g., a single-crystal Si layer) is formed flat and uniformly in the entire region on the surface of the second substrate 55.

When an insulating substrate is used as the second substrate 55, the semiconductor substrate obtained by the above manufacturing method is very applicable to form an insulated electronic device.

An embodiment of an anodizing apparatus for obtaining a single-crystal substrate having a porous Si layer on the surface, as shown in FIG. 1A, will be described next.

Formation of a porous silicon substrate by anodizing or formation of pores is performed in, e.g., an HF solution. It is known that the presence of holes is essential for this processing, and the reaction mechanism is estimated as follows.

First, holes in the silicon substrate applied with an electric field in the HF solution are induced on the surface on the negative electrode side. Consequently, the density of Si—H bonds compensating for the unbonded element on the surface becomes high. At this time, F ions in the HF solution on the negative electrode side nucleophilically attack the Si—H bonds to form Si—F bonds. Bythis reaction, $H_2$ molecules are generated, and simultaneously, one electron is emitted to the positive electrode side. Si—Si bonds near the surface weaken due to the polarization characteristics of Si—F bonds. This weak Si—Si bonds are attacked by HF or $H_2O$, so Si atoms on the surface become $SiF_4$ and are eliminated from the crystal surface. As a consequence, recessed portions are formed in the crystal surface. A field distribution (field concentration) for preferentially attracting holes is generated at this portion. This surface heterogeneity extends, so etching of silicon atoms continuously progresses along the electric field. The solution used for anodizing is not limited to the HF solution, and any other electrolytic solution can be used.

Figure 2:
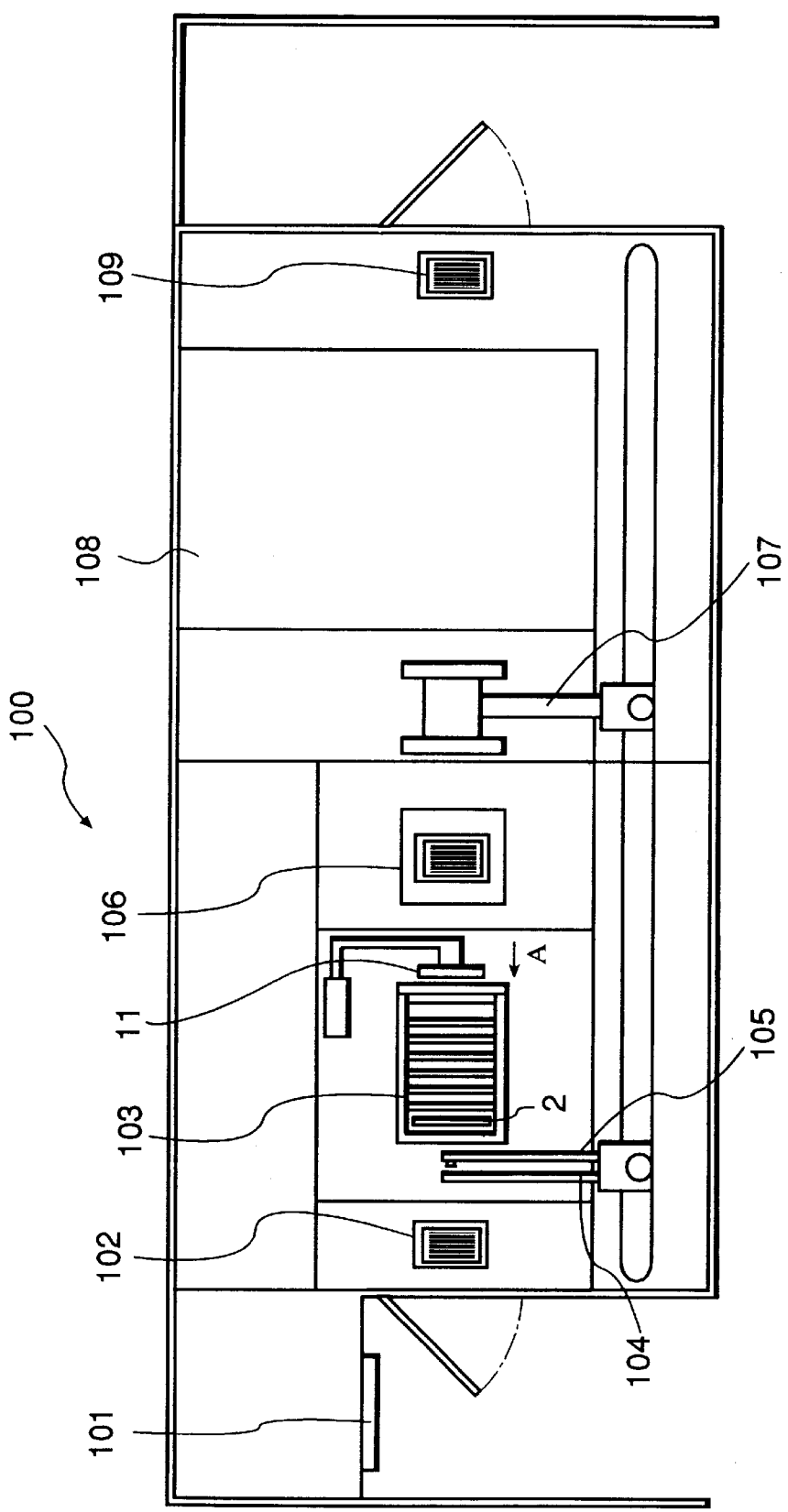
FIG. 2 is a plan view showing the overall arrangement of an anodizing apparatus according to an embodiment.

FIG. 2 is a plan view showing the overall arrangement of the anodizing apparatus of this embodiment.

Operation of an anodizing apparatus 100 is controlled by, e.g., a computer. Reference numeral 101 denotes a control panel. When a substrate carrier is placed on a loader 102, the loader 102 transfers the substrate to a single substrate conveyor robot 104. The wafer conveyor robot 104 removes substrates from the loader 102 one by one, conveys the substrate to an anodizing tank 103, and transfers the substrate to a robot 105. The robot 105 causes a holder in the anodizing tank 103 to chuck the received substrate. The anodizing tank 103 can simultaneously support seven substrates. When seven substrates are stored in the anodizing tank 103, a positive electrode 11 moves in a direction indicated by an arrow A (details will be described later) and comes into contact with the seventh substrate. After this, the anodizing tank 103 is filled with an electrolytic solution, and a voltage is applied across the positive electrode 11 and a negative electrode 2 arranged in the anodizing tank 103, thereby performing anodizing.

The anodized substrate is removed from the anodizing tank 103 by the robot 105, mounted on a carrier in a washing tank 106, and washed.

When washing is complete, the substrate is conveyed to a drier 108 by a carrier conveyor robot 107 together with the carrier.

When drying by the drier 108 is complete, the substrate is conveyed by the carrier conveyor robot 107 again together with the carrier and transferred to an unloader 109 for unloading the substrate.

Figure 3:
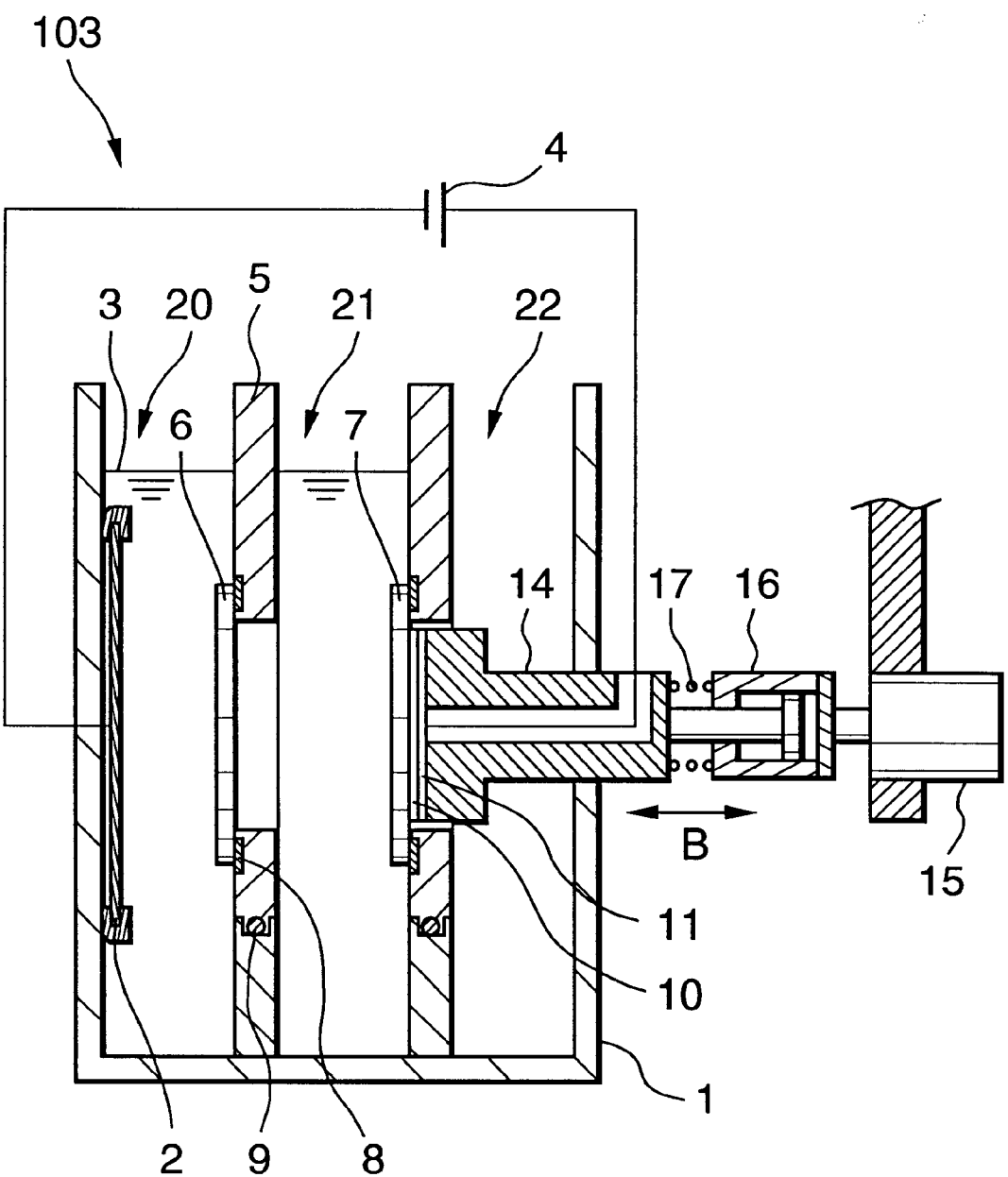
FIG. 3 is an enlarged sectional view of an anodizing tank portion in FIG. 2.

FIG. 3 is an enlarged sectional view showing the anodizing tank 103 in FIG. 2. The anodizing tank 103 can store seven silicon substrates in fact, though FIG. 3 shows a simple structure for storing two silicon substrates for the descriptive convenience.

Referring to FIG. 3, reference numerals 6 and 7 denote single-crystal silicon substrates (wafers). Generally, since the presence of holes is important for anodizing, a p-type silicon substrate is suitable. However, even an n-type silicon substrate can be used by prompting generation of holes by light irradiation or the like.

The positive electrode 11 and negative electrode 2 are preferably formed from a chemically stable platinum material. The positive electrode 11 and negative electrode 2 are connected to a power supply 4.

A conductive partition 10 is fixed to the positive electrode 11. The positive electrode 11 contacts the silicon substrate 7 via the conductive partition 10. The conductive partition 10 prevents the silicon substrate from being contaminated by the electrode material when the positive electrode 11 comes into direct contact with the silicon substrate 7. In this embodiment, a silicon substrate of the same material as that of the silicon substrate 7 to be anodized is used. It is supposed that when the substrates are made of the same silicon material, the silicon substrate 7 to be processed is not contaminated by the silicon material of the conductive partition 10. The conductive partition 10 is preferably formed from a material having a low resistivity not to impede current flow from the positive electrode 11 to the silicon substrate 7. In this sense, silicon is a preferable material. However, any material other than silicon can be used as the material of the conductive partition 10 as far as it has a low resistivity and does not contaminate the silicon substrate 7 to be processed.

To fix the conductive partition 10 on the positive electrode 11, a plurality of holes having a diameter of about 5 mm or less are formed in the platinum plate forming the positive electrode 11, and these holes are filled with an adhesive to directly bond the conductive partition 10 to a supporter 14 of the positive electrode 11. Alternatively, the conductive partition 10 may be vacuum-chucked using these holes.

The conductive partition 10 and positive electrode 11 preferably have the same area. However, the diameter of the positive electrode 11 may be smaller than the conductive partition 10 by about 20 mm. The conductive partition 10 preferably has a thickness similar to that of the silicon substrate 7 to be processed in fact because when the conductive partition 10 is thin, the field distribution becomes nonuniform, and when the conductive partition 10 is thick, the electrical resistance increases. The sizes of the conductive partition 10 and positive electrode 11 are preferably as close to the silicon substrate 7 to be processed as possible.

The positive electrode 11 is driven in a direction indicated by an arrow B by a driving source 15 such as an air cylinder or a plunger. The positive electrode 11 is moved to a position where the positive electrode 11 comes into contact with the silicon substrate 7 and a position separated from the silicon substrate 7. A compression spring 17 is inserted between a shaft 16 of the driving source 15 and the supporter 14. When the shaft 16 projects from the driving source 15, the positive electrode 11 is pressed against the silicon substrate 7 by the biasing force of the compression spring 17. The biasing force of the compression spring 17 is set not to deform the silicon substrate 7.

To determine whether the positive electrode 11 is in contact with the silicon substrate 7, a signal for causing the driving source 15 to project the shaft 16 is detected to determine that the positive electrode 11 is in contact with the silicon substrate 7, or a current is actually flowed between the positive electrode 11 and the negative electrode 2 after supply of an electrolytic solution (HF) 3 into the anodizing tank 103, and electrical connection between the positive electrode 11 and the negative electrode 2 is detected for determination.

Holders 5 for supporting the silicon substrates 6 and 7 are made of, e.g., ethylene tetrafluoride (tradename: Teflon) or a material having HF resistance. The holder 5 has an opening having a circle or circular shape and a diameter smaller than that of the silicon substrate to be supported (a circular shape includes a shape close to a circle hereinafter).

An annular groove is formed at the peripheral portion of the opening of each holder 5, and an O-ring 8 having HF resistance is fitted in this groove. Air is exhausted from a hole (not shown) formed at the bottom portion of this groove, thereby chucking and fixing the silicon substrate 6 or 7 on the holder 5 via the O-ring 8. The holder 5 also has, at its lower portion, a seal member 9 for isolating the electrolytic solution 3.

Chambers 20, 21, 22 of an anodizing tank main body 1 are completely isolated by the O-rings 8 and seal members 9 via the silicon substrates 6 and 7. The electrolytic solution 3 supplied to the two chambers 20 and 21 of the anodizing tank main body 1 does not leak to the chamber 22 located at the right end of the anodizing tank main body 1. Since the conductive partition 10 neither contacts the electrolytic solution 3 nor is anodized, the conductive partition 10 need not be exchanged for a long time, so the silicon material is prevented from being wasted.

Figure 4:
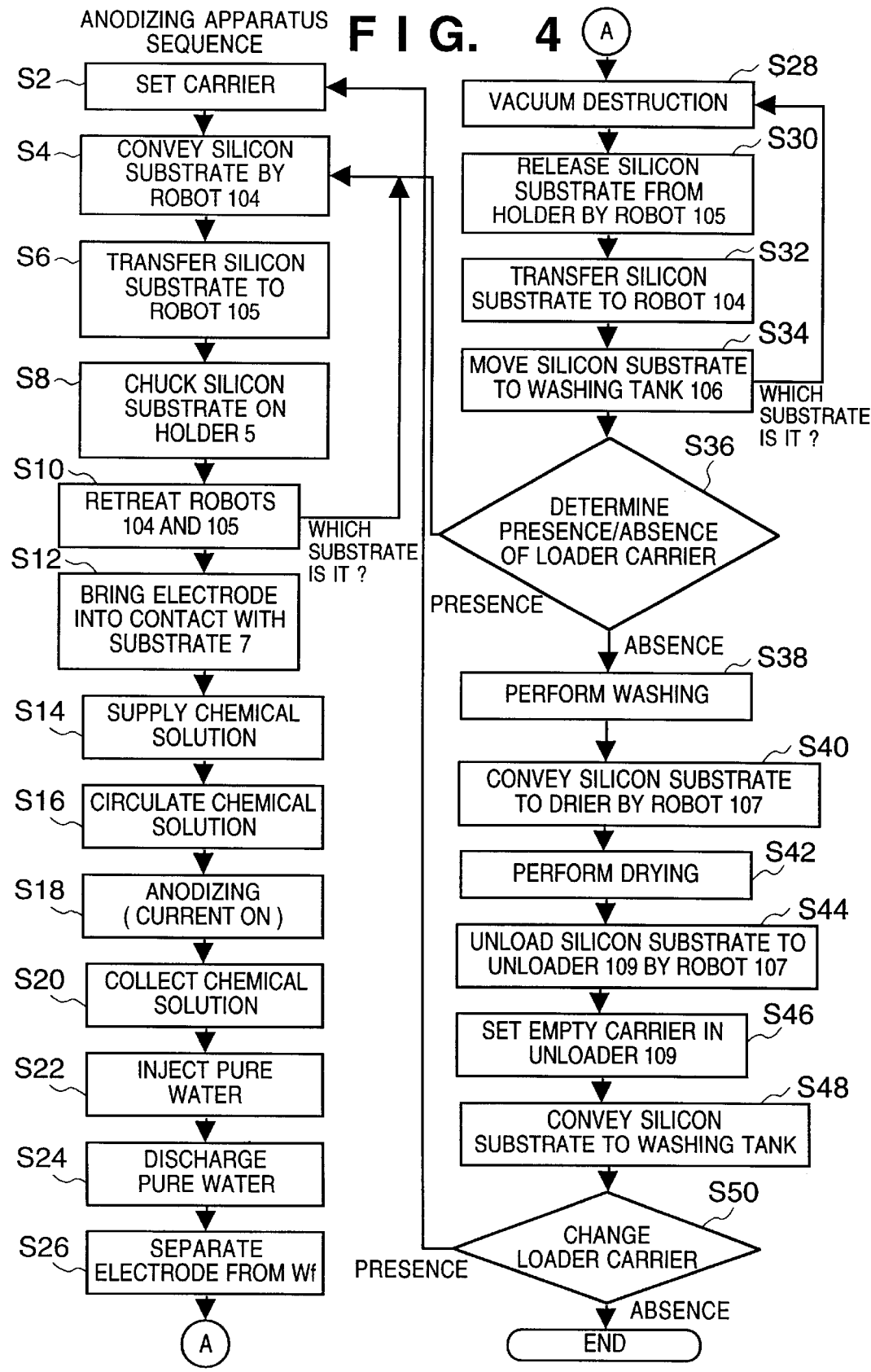
FIG. 4 is a flow chart for explaining operation of the anodizing apparatus.

Operation of the anodizing apparatus having the above arrangement will be described next with reference to FIGS. 2 and 3 and the flow chart of FIG. 4.

A carrier on which silicon substrates are mounted is set in the loader 102 (step S2). Each silicon substrate is conveyed from the loader 102 to the anodizing tank 103 by the robots 104 and 105 until seven silicon substrates are chucked by the holder 5 (steps S4 to S10).

The driving source 15 is driven to bring the positive electrode 11 into contact with the silicon substrate 7 via the conductive partition 10 (step S12).

The electrolytic solution 3 is supplied to the anodizing tank 103 and circulated, and the power supply 4 is turned on to perform anodizing (steps S14 to S18).

The electrolytic solution is discharged from a discharge port (not shown) formed in the anodizing tank 103, and pure water is supplied to the anodizing tank 103 (steps S20 to S22). With this operation, the silicon substrates are roughly cleaned.

The pure water is discharged from the anodizing tank 103, and the positive electrode 11 is separated from the silicon substrate 7 (steps S24 to S26).

In this state, each silicon substrate is released and moved to a carrier in the washing tank 106. This operation is repeatedly performed for the seven silicon substrates (steps S28 to S34).

Normally, 25 silicon substrates are stored in the carrier supplied to the loader 102. It is determined whether silicon substrates remain on the carrier on the loader (step S36). If any silicon substrates remain, the process from step S4 to step S36 is repeated. If it is determined in step S36 that no silicon substrate remains on the carrier on the loader 102, anodizing of 25 silicon substrates is complete, so 25 anodized silicon substrates are stored on the carrier in the washing tank 106.

The anodized silicon substrates are washed, and the washed silicon substrates are conveyed to the drier 108 by the robot 107 together with the carrier and dried (steps S38 to S42).

The dried silicon substrates are conveyed to the unloader 109 by the robot 107 together with the carrier and unloaded (step S44).

The empty carrier is set in the unloader 109, conveyed to the washing tank 106 by the robot 107, and sank in the washing tank 106.

Finally, a carrier storing new silicon substrates is set in the loader 102, and the operation from step S2 to step S50 is repeated.

If it is determined in step S50 that no carriers storing new silicon substrates remain, the operation of the apparatus is ended.

As described above, according to the above embodiment, since the conductive partition 10 for preventing contamination of the silicon substrate is inserted between the positive electrode 11 and the silicon substrate 7, contamination of the silicon substrate due to the electrode material can be prevented.

In addition, since the positive electrode 11 does not contact the electrolytic solution, the conductive partition 10 is not anodized and can be repeatedly used, so the silicon material can be prevented from being wasted.

The present invention can be applied to changes and modifications of the above embodiment without departing the spirit and scope of the invention.

As has been described above, according to the present invention, an anodizing apparatus and method capable of efficiently performing anodizing while preventing wafer contamination are provided.

The present invention is not limited to the above embodiments and various changes and modifications can be made within the spirit and scope of the present invention. Therefore, to apprise the public of the scope of the present invention, the following claims are made.

What is claimed is:

1. An anodizing apparatus for anodizing a substrate by an electrolytic solution, comprising:

a process tank for storing the electrolytic solution, said process tank having an opening in a wall;

a positive electrode having a flat contacting surface adapted to contact a surface of the substrate arranged to close the opening from an inside of said process tank, the surface being open outside said process tank through the opening; and a negative electrode arranged to oppose the substrate which closes the opening.

2. The apparatus according to claim 1, further comprising at least one substrate holder arranged inside of said process tank, said substrate holder being adapted to support at least another substrate at a position between the negative electrode and the substrate.

3. The apparatus according to claim 1, further comprising moving means for moving said positive electrode close to or away from the substrate.

4. The apparatus according to claim 3, wherein said moving means comprises a support member for supporting said positive electrode, a spring arranged between said positive electrode and said support member to elastically support said positive electrode, and a driving source for moving said support member.

5. The apparatus according to claim 4, wherein said driving source comprises an air cylinder.

6. The apparatus according to claim 4, wherein said driving source comprises a plunger.

7. The apparatus according to claim 1, wherein said positive electrode comprises a metal plate and an intermediate substrate disposed between said metal plate and said substrate, and made of a material which has a low electrical resistance and does not contaminate the substrate.

8. The apparatus according to claim 7, wherein said intermediate substrate is made of the same material as that of the substrate.

9. The apparatus according to claim 8, wherein the substrate and said intermediate substrate are made of single-crystal silicon.

10. An anodizing method of anodizing a substrate by an electrolytic solution, comprising:

the setting step of setting the substrate inside a process tank having an opening on a wall to close the opening;

the supply step of supplying the electrolytic solution into the process tank;

the contacting step of bringing a positive electrode having a flat contacting surface adapted to come into contact with a portion of the substrate, which is open outside the process tank through the opening; and the process step of flowing a current between the positive electrode and a negative electrode arranged to oppose the substrate to anodize the substrate to be processed.

11. The method according to claim 10, further comprising:
- the first discharge step of discharging the electrolytic solution from the process tank;
- the cleaning step of supplying pure water into the process tank to clean the substrate;
- the second discharge step of discharging the pure water from the process tank;
- the separation step of separating the positive electrode from the substrate; and
- the removal step of removing the substrate from the process tank.

12. The method according to claim 10, wherein at least one other substrate is held by a substrate holder arranged inside of said process tank between the negative electrode and the substrate.

13. The method according to claim 10, further comprising the contacting step of, after the substrate is set in the process tank, bringing the positive electrode into contact with the substrate.

14. The method according to claim 10, wherein the positive electrode comprises a metal plate and an intermediate substrate disposed between said metal plate and said substrate, and made of a material which has a low electrical resistance and does not contaminate the substrate.

15. The method according to clam 14, wherein the intermediate substrate is made of the same material as that of the substrate.

16. The method according to claim 15, wherein the substrate and the intermediate substrate are made of single-crystal silicon.

17. A manufacturing method of manufacturing a semiconductor substrate comprising the steps of:
- forming a porous layer in a surface of the substrate by the anodizing method according to claim 10;
- forming a non-porous layer on the porous layer;
- bonding a second substrate to the non-porous layer; and
- eliminating the substrate so that the non-porous layer remains on the second substrate.

* * * * *

UNITED STATES PATENT AND TRADEMARK OFFICE
CERTIFICATE OF CORRECTION

PATENT NO.         : 6,258,240 B1                                          Page 1 of 1
APPLICATION NO. : 09/211418
DATED              : July 10, 2001
INVENTOR(S)        : Satoshi Matsumura et al.

It is certified that error appears in the above-identified patent and that said Letters Patent is hereby corrected as shown below:

ON THE COVER PAGE:

ITEM [54] and Col. 1, line 1, the title should read:
-- ANODIZING APPARATUS AND METHOD AND POROUS SUBSTRATE --

ITEM [56]: References Cited, Other Publications:

"Derwent Abstract Accession No. 94-206586 SE 500333-B (Grimmeiss), Jun. 6, 1994" should read -- Derwent Abstract Accession No. 94-206586 Class U11 SE 500333-B (Grimmeiss), Jun. 6, 1994 --

Figure 5:
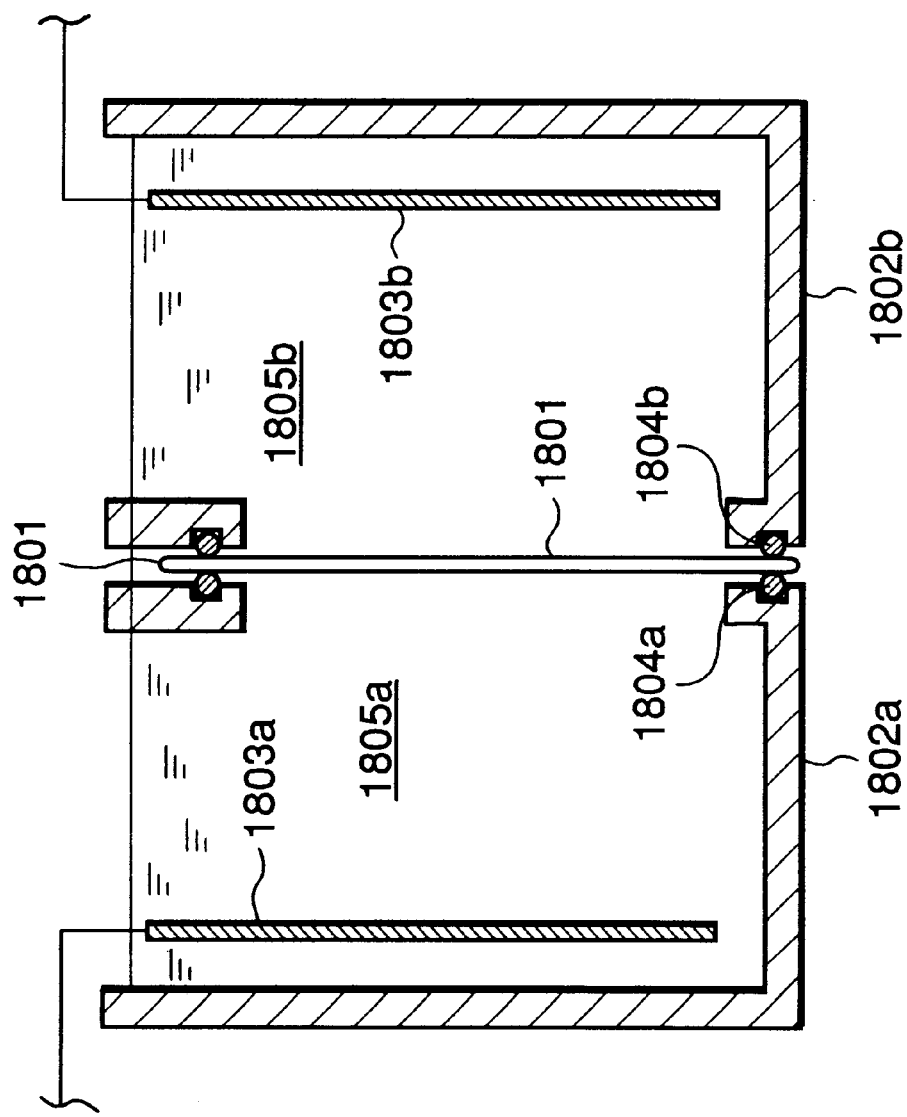
FIG. 5 is a view showing the arrangement of a conventional anodizing apparatus.

IN THE DRAWINGS:

Sheet 5 of 5, Fig. 5 should be labeled -- PRIOR ART --.

Signed and Sealed this

Eighth Day of August, 2006

JON W. DUDAS
*Director of the United States Patent and Trademark Office*